(12) United States Patent
Fry

(10) Patent No.: US 7,475,053 B2
(45) Date of Patent: Jan. 6, 2009

(54) METHOD AND SYSTEM FOR THE AUTONOMOUS DESIGN OF CYBERNETIC SYSTEMS

(75) Inventor: Robert L. Fry, New Windsor, MD (US)

(73) Assignee: The Johns Hopkins University, Baltimore, MD (US)

( * ) Notice: Subject to any disclaimer, the term of this patent is extended or adjusted under 35 U.S.C. 154(b) by 1528 days.

(21) Appl. No.: 10/332,432

(22) PCT Filed: Jul. 13, 2001

(86) PCT No.: PCT/US01/22022

§ 371 (c)(1),
(2), (4) Date: Jan. 8, 2003

(87) PCT Pub. No.: WO02/10868

PCT Pub. Date: Feb. 7, 2002

(65) Prior Publication Data

US 2003/0208453 A1 Nov. 6, 2003

Related U.S. Application Data

(60) Provisional application No. 60/221,008, filed on Jul. 27, 2000.

(51) Int. Cl.
*G06F 15/00* (2006.01)
*G06F 15/18* (2006.01)
(52) U.S. Cl. ...................................... 706/62
(58) Field of Classification Search ............... None
See application file for complete search history.

(56) References Cited

U.S. PATENT DOCUMENTS

| | | | | |
|---|---|---|---|---|
| 5,090,642 A * | 2/1992 | Salkeld | .................... | 244/171.3 |
| 5,123,327 A * | 6/1992 | Alston et al. | ................ | 89/1.813 |
| 5,163,176 A * | 11/1992 | Flumerfelt et al. | .......... | 342/174 |
| 5,177,316 A * | 1/1993 | Honigsbaum | ................ | 89/1.11 |
| 5,198,607 A * | 3/1993 | Livingston et al. | ........... | 89/1.11 |
| 5,244,849 A * | 9/1993 | Roy et al. | .................... | 501/120 |
| 5,479,255 A * | 12/1995 | Denny et al. | ................. | 356/319 |
| 5,557,347 A * | 9/1996 | Johnson | .................. | 356/139.08 |
| 5,615,846 A * | 4/1997 | Shmoldas et al. | .......... | 244/3.28 |
| 6,163,372 A * | 12/2000 | Sallee et al. | ................. | 356/5.1 |
| 6,273,756 B1 * | 8/2001 | Ward et al. | ................... | 439/607 |
| 6,347,567 B1 * | 2/2002 | Eckstein | ..................... | 89/1.59 |
| 6,487,516 B1 * | 11/2002 | Amorai-Moriya | ........... | 702/152 |

(Continued)

OTHER PUBLICATIONS

Electric Charging and Discharging Processes of Moving Projectiles Ter Haseborg, J.L.; Trinks, H.; Aerospace and Electronic Systems, IEEE Transactions on vol. AES-16, Issue 2, Mar. 1980 pp. 227-232 Digital Object Identifier 10.1109/TAES.1980.308957.*

(Continued)

*Primary Examiner*—Michael B Holmes
(74) *Attorney, Agent, or Firm*—Francis A. Cooch

(57) ABSTRACT

A system and method is provided for constructing optimal based systems. The method is based on a process of formalized rational inquiry, measurement and planned action. More particularly, the method relies upon the precise determination of alternatives through inquiry, a formal logical model of measurement, and the subsequent matching of information obtained through measurement to possible courses of action to arrive at a realizable and useful system architecture

13 Claims, 4 Drawing Sheets

U.S. PATENT DOCUMENTS

| | | | | |
|---|---|---|---|---|
| 6,499,407 | B2 * | 12/2002 | Brum | 102/505 |
| 6,510,798 | B2 * | 1/2003 | Brum | 102/505 |
| 6,513,438 | B1 * | 2/2003 | Fegg et al. | 102/336 |
| 6,571,714 | B1 * | 6/2003 | Brum et al. | 102/336 |
| 6,634,299 | B2 * | 10/2003 | Vetter et al. | 102/288 |
| 6,666,401 | B1 * | 12/2003 | Mardirossian | 244/3.11 |
| 6,687,279 | B2 * | 2/2004 | Ullman et al. | 372/89 |
| 6,714,579 | B2 * | 3/2004 | Ullman et al. | 372/89 |
| 6,741,341 | B2 * | 5/2004 | DeFlumere | 356/141.1 |
| 6,988,705 | B1 * | 1/2006 | Hoose | 251/120 |
| 7,016,292 | B1 * | 3/2006 | Hayes et al. | 369/126 |
| 7,023,895 | B2 * | 4/2006 | Ullman et al. | 372/89 |
| 7,028,947 | B2 * | 4/2006 | Burns | 244/1 TD |
| 7,035,307 | B2 * | 4/2006 | Ullman et al. | 372/89 |
| 7,079,070 | B2 * | 7/2006 | Kongelbeck et al. | 342/62 |
| 7,190,725 | B2 * | 3/2007 | Pirim | 375/240.27 |
| 7,207,517 | B2 * | 4/2007 | McKendree et al. | 244/3.15 |
| 7,236,121 | B2 * | 6/2007 | Caber | 342/62 |
| 7,265,712 | B2 * | 9/2007 | Merkel et al. | 342/195 |
| 7,299,734 | B2 * | 11/2007 | Holloway | 89/1.11 |
| 7,328,644 | B2 * | 2/2008 | Vickroy | 89/1.11 |
| 7,367,525 | B2 * | 5/2008 | McKendree et al. | 244/3.15 |
| 7,367,531 | B2 * | 5/2008 | Greene | 244/195 |
| 7,370,836 | B2 * | 5/2008 | Greene | 244/195 |
| 7,411,543 | B1 * | 8/2008 | Boka | 342/90 |
| 7,427,759 | B1 * | 9/2008 | Pruvot et al. | 250/338.1 |

OTHER PUBLICATIONS

Development of Low-Cost Multifunction Sensors for Lightweight Fire and Forget Antitank Weapon System Hunter, Joe S.; Hung, James C.; Industrial Electronics, IEEE Transactions on vol. IE-30, Issue 1, Feb. 1983 pp. 1-6 Digital Object Identifier 10.1109/TIE.1983.356695.*

Application of ray tracing to predicting the properties of a small, axially symmetric, missle radome Tricoles, G.; Antennas and Propagation, IEEE Transactions on vol. 14, Issue 2, Mar. 1966 pp. 244-246.*

Cable Reliability in Ground Guided Missle Systems Spergel, J.; Godwin, E.; Component Parts, IRE Transactions on vol. 7, Issue 2, Jun. 1960 pp. 54-60.*

Anti-windup nonlinear PID controller design and its application to winged missile control system Li Congying,; Wang Shixing,; Yue Zhi,; Yu Jinyong,; Wang Huijin,; Control Conference, 2008. CCC 2008. 27th Chinese Jul. 16-18, 2008 pp. 377-379 Digital Object Identifier 10.1109/CHICC.2008.4605822.*

Nonlinear absorption processes in infrared transmitting materials for pulsed CO2lasers Shatas, R.; Narducci, L.; Smith J.; Stettler, J.; Meyer, H.; Mitra, S.; Quantum Electronics, IEEE Journal of vol. 10, Issue 9, Sep. 1974 pp. 734-735.*

The Use of Magnetic Fields in the Elimination of the Re-Entry Radio Blackout Hodara, H.; Proceedings of the IRE vol. 49, Issue 12, Dec. 1961 pp. 1825-1830 Digital Object Identifier 10.1109/JRPROC.1961.287709.*

Electric Charging and Discharging Processes of Moving Projectiles Ter Haseborg, J.L.; Trinks, H.; Aerospace and Electronic Systems, IEEE Transactions on vol. AES-16, Issue 2, Mar. 1980 pp. 227-232 Digital Object Identifier 10.1109/TAES.1980.308957.*

Intelligent sensor resource management using evolutionary computing techniques Burgess, D.W.; Levins, C.L.; Integration of Knowledge Intensive Multi-Agent Systems, 2003. International Conference on Sep. 30-Oct. 4, 2003 pp. 325-329.*

Ground based radar-prototype (GBR-P) antenna Crawford, J.F.; Reed, E.; Hines, J.J.; Schmidt, D.R.; Antennas and Propagation, 1999. IEE National Conference on. Mar. 31-Apr. 1, 1999 pp. 249-252.*

A Hybrid, Large-scale Wireless Sensor Network for Missile Defense Katopodis, P.; Katsis, G.; Walker, O.; Tummala, M.; Michael, J.B.; System of Systems Engineering, 2007. SoSe '07. IEEE International Conference on Apr. 16-18, 2007 pp. 1-5.*

Multisensor fusion using a new procedure for ballistic path estimation Zabriskie, G.R.; Cummings, C.A.; Rogers, E.A.; Multisensor Fusion and Integration for Intelligent Systems, 1994. IEEE International Conference on MFI'94. Oct. 2-5, 1994 pp. 521-528.*

Instrumentation for ballistic missile defense: lessons learned from the LEAP experiment Fowler, K.R.; Instrumentation and Measurement, IEEE Transactions on vol. 47, Issue 5, Oct. 1998 pp. 1092-1095 Digital Object Identifier 10.1109/19.746562.*

Instrumentation for ballistic missile defense: lessons learned from the LEAP experiment Fowler, K.R.; Instrumentation Measurement Technology Conference, 1998. IMTC/98. Conference Proceedings. IEEE vol. 1, May 18-21, 1998 pp. 56-59 vol. 1 Digital Object Identifier 10.1109/IMTC.1998.679660.*

Time-optimal impact angle control for vertical plane engagements Taek Lyul Song; Sang Jin Shin; Aerospace and Electronic Systems, IEEE Transactions on vol. 35, Issue 2, Apr. 1999 pp. 738-742 Digital Object Identifier 10.1109/7.766954.*

Multiple hypothesis tracking for multiple target tracking Blackman, S.S.; Aerospace and Electronic Systems Magazine, IEEE vol. 19, Issue 1, Part 2, Jan. 2004 pp. 5-18 Digital Object Identifier 10.1109/MAES.2004.1263228.*

Amkreutz J H A E: "Cybernetic Model of the Design Process" Computer-Aided Design, IPC Business Press, Haywards Heath, GB. vol. 8, No. 3 Julu 1976 (Jul. 1976), pp. 187-192.

Arkin R C: "The Impact of Cybernetics on the Design of a Mobile Robot System: A Case Study" IEEE Transactions on Systems, Man and vol. 20, No. 6 Nov. 1990, pop. 1245-1257.

Trip R S et al: "Small-scale demonstration of cybernetic technology and its application to the air force logistics command (AFKC) Command, Control, Communication, and Intelligence System" Cybernetics and Systems, New York, NY US, vol. 19 No. 5, 1988, pp. 441-471.

\* cited by examiner

METHOD AND SYSTEM FOR THE AUTONOMOUS DESIGN OF CYBERNETIC SYSTEMS

CROSS-REFERENCE TO RELATED APPLICATION

This application claims the benefit of prior filed U.S. Provisional Patent Application No. 60/221,008, filed on Jul. 27, 2000.

BACKGROUND OF THE INVENTION

1. Field of the Invention

The present invention relates to a system design method, and more particularly to a system and method for constructing optimal cybernetic based systems.

2. Description of the Related Art

Few problems encountered in everyday experience have perfect solutions either because there is insufficient information to solve it perfectly or, having sufficient information, the actions necessary to achieve the desired goal are unable to be performed. Almost always, there is some information upon which to make intelligent decisions or effect actions regarding what we should say or should do. The important points are that one desires to optimally exploit what is known at the instant time when a decision is made or an act effected and that one should be able to anticipate what additional information will be needed in the future to effect future actions.

As such, a common approach to problem solving is to obtain the necessary information, make necessary interferences, and carry out required actions in the "best" way possible given the practical constraints of limited knowledge and limited abilities to act. The present invention provides a quantitative definition for what is meant by "best" and a way of exploiting this definition towards a formal design methodology for systems that operate cybernetically.

Were it somehow possible to predict the future, control requirements could be greatly relaxed. However, almost always, we possess some ability to act in the present based on our limited ability to predict the future. Predictive abilities are constrained primarily by two factors (1) the ability to make necessary measurements in the past and (2) the ability to extract the relevant information content from those measurements as pertinent to the subject predictions. Therefore, it is apparent that the ability to predict the future relies heavily on the ability to pose good questions. In turn, and based on the ability to predict the future, controls and actions can be tailored and made more efficient. The essential idea of this invention is that one can quantitatively match the acquisition of information by a system to the intended actions of the system and do so for practical and useful systems.

SUMMARY OF THE INVENTION

The present invention generally provides a method for quantifying information, control, and their relationship to each other to construct optimal cybernetic-based systems. The method of the present invention is based on a process of formalized rational inquiry, measurement and planned action. The process relies upon the precise determination of alternatives through inquiry, a formal logical model of measurement and the subsequent matching of this information to possible courses of action at the present and into the future. More particularly, the method of the present invention applies a formalized joint logic of logical questions and assertions to formalize design or engineering objectives and arrive at a realizable and useful cybernetic system architecture.

The term "system" as used herein refers to a physical or synthesized structure that transforms inputs into outputs. Such systems may be electronic, mechanical, biological, chemical, algorithms and processes, or any combination thereof with the common assumption that the system has a definitive design objective that represents its functional design purpose.

In accordance with the method of the present invention, the method generally includes the steps of specifying a computational objective, defining or delineating one or more questions that the system can pose to the external world and which may possibly be constrained by the resources of the system or may vary with time, defining or delineating one or more questions that the system can answer to effect control or transmit information and which may possibly be constrained by the resources of the system or may vary with time, applying an inductive logic formalism of logical questions and assertions to quantify the computational objective and ultimately arrive at a cybernetic system architecture.

One advantage of the present invention is its widespread applicability to areas including, but not limited to, automatic object classification, information fusion, neural networks, specialized algorithm design, data mining intelligent systems, systems engineering, general design and construction of inductive logic computers (ILCs). Such widespread applicability is realized by virtue of the fact that the methodology provides a common framework for the design of systems, algorithms, machines or processes that operate cybernetically.

BRIEF DESCRIPTION OF THE DRAWINGS

The accompanying drawings, which are incorporated in and constitute a part of the specification, illustrate preferred embodiments of the invention, and together with the description, serve to explain the principles of the invention.

DETAILED DESCRIPTION OF THE PREFERRED EMBODIMENTS

To more fully appreciate the method of the present invention for automatically constructing cybernetic-based systems, it is instructive to first provide some background regarding particular characteristics which collectively define a cybernetic system. The concept of cybernetics captures the synergistic relationship between information and control. Accordingly, cybernetic systems may be characterized in one sense through the notion of "objective subjectivity" whereby information and control are considered to be subjective properties of a system and represent complementary aspects of a machine or system having some computational purpose.

Information and control are deemed subjective properties of a system. The present invention proposes that these properties can lend themselves to universal and objective rules of design and manipulation. Information and its acquisition characterize the operation of a system attempting to ascertain a "state-of-nature" posited to exist external to the system. Similarly, action (i.e., control) describes the intent of a system to place the world external to the system in a posited and purposeful state thereby having it acquire a particular "state-of-nature". In both cases (i.e., information and control), the ascertion of a posited "state-of-nature" and the acquisition of a particular "state-of-nature" are subjective properties of the system to be constructed. That is, they are determined from the vantage point or perspective of the system. However, the logical rules afforded the cybernetic system for constructing questions to ascertain a state-of-nature and for taking action or exerting control can be rigorously derived and are universal in nature in that they apply to all cybernetic systems. In this sense, such systems can objectively be formulated and designed.

Furthermore, cybernetic systems adaptively balance their need for information to their need to effect control relative to the functional objectives of the system. Balancing information needs with the need to effect control translates into the system acquiring sufficient information to support the execution of those controls or actions necessary to resolve the computational issue or objective of the system.

Figure 1:
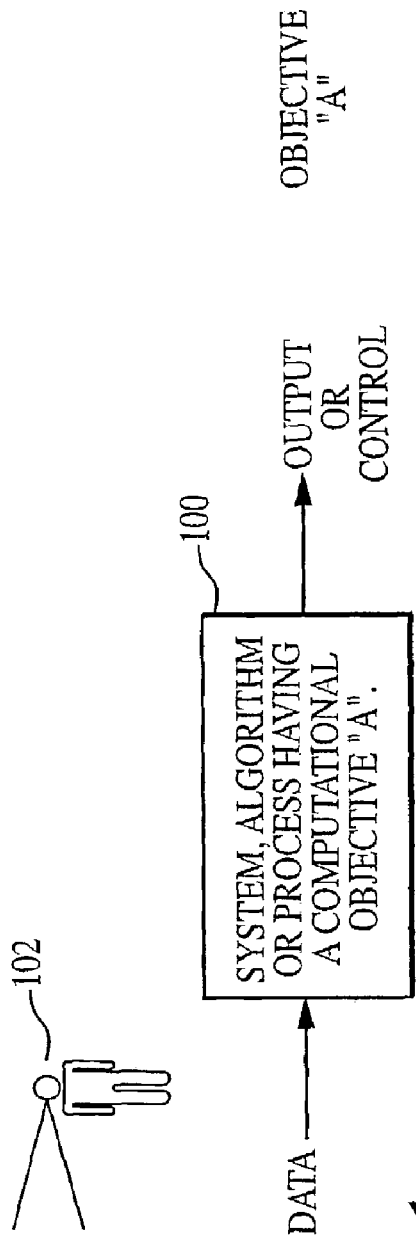
FIG. 1 is an illustration of a conventional system which acquires information to be processed and converted into an output signal or control, in accordance with the prior art.

FIG. 1 is a block diagram illustrating the operational characteristics of a system 100 configured in accordance with a prior art scheme. The system receives and processes inputs and outputs or control signals to achieve some objective, e.g., a computational solution to a mathematical problem. According to FIG. 1, observations of the external world are made by an observer 102 external to the system 100, the information is processed by the system 100 to effect some kind of output or control to achieve the objective, "A". As shown, this process is unidirectional (i.e., without feedback). That is, there is no interplay or synergy between information and control according to this prior art configuration.

One Embodiment

Figure 2:
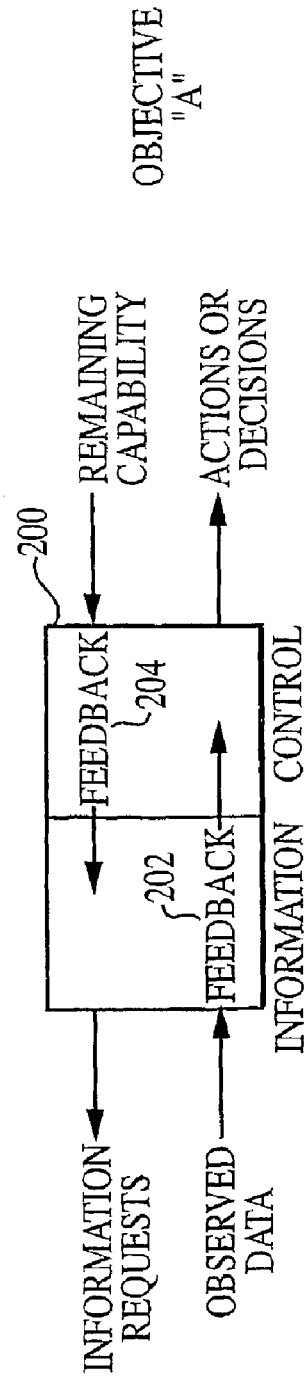
FIG. 2 is an illustration of a cybernetic systems in accordance with one embodiment of the present invention that employs two feedback paths.

FIG. 2 is a block diagram illustrating the operational characteristics of how a system 200 processes inputs and outputs in accordance with the present invention. In contrast to the prior art system 100 of FIG. 1, there is an interplay or synergy between information and control as embodied by the feedback processes shown in the system 200. In particular, a cybernetic algorithm for controlling the system 200 concurrently executes two feedback mechanisms, a first feedback process 202 which acquires sufficient information to support the execution of actions necessary to resolve the computational issue of the system 200 and a second feedback loop 204 wherein future possible actions are determined given those already taken as well as levying new requirements for additional information thus completing the feedback process. These two feedback mechanisms must exist within any useful cybernetic system.

The first feedback process 202 attempts to null the disparity between information required (to effect a control strategy) and the information obtained thus far. The second feedback process 204 attempts to maximize the possible useful control space that remains subsequent to actions that are taken, thereby retaining for the future as many relevant control options as possible. As an example, consider a scenario of taking a trip by car from a familiar point A to another familiar point B. The drive will consist of alternating cycles of viewing successive familiar landmarks (first feedback process) and making the necessary accelerations and re-directions that make the trip possible (second feedback process). This is done interactively until the trip is complete.

The operational characteristics, as described in FIG. 2, describe information and control as representing complementary aspects of a system, machine, algorithm, process, etc. having some design objective.

FIGS. 3 and 4 illustrate two I-diagram sequences which depict, at a conceptual level, the control and information state dynamics which occur in the cybernetic system 200 of FIG. 2 for achieving some design objective. I-diagrams, as used herein, provide a pictorial representation of the design objective of the present invention. In particular, it is the objective of the present invention to provide a methodology for the design of systems, algorithms, or processes that match available information "I" to required control "C" to satisfy a design objective "A". The I-diagrams in FIGS. 3 and 4 illustrate this dynamic matching process.

As stated above, few problems encountered in everyday experience have perfect solutions either because there is insufficient information to solve it perfectly or, having sufficient information, the actions necessary to achieve the desired goal are unable to be performed. In part, limitations on our ability to perfectly achieve a desired goal act can be traced to the fact that available information intrinsically lags desired control in time. However, there is always some information upon which to make intelligent decisions or effect actions regarding what we should say or do. The point being is that one desires to optimally exploit what is known at the time instant when a decision is made or an act effected. Implied in this statement is the fact that information has a certain degree of uncertainty or entropy.

The glass half full/half empty analogy is appropriate to further clarify this idea. Considering the glass to be an analog of the system 200, the empty part of the glass or system represents ignorance about the outside world (i.e., state-of-nature) that is to be eliminated through the posing of intelligent questions. The filled part of the glass represents knowledge obtained through posing questions which is available for use in control or decisioning. As such, the information space, "I", as illustrated in the I-diagrams of FIGS. 3 and 4 represent the system's 200 imperfect knowledge about the external world at some point in time. The control space, "C", represents the ability of the system 200 to act or exert control based on the imperfect knowledge about the external world obtained thus far. A system 200 having some well-defined computational or design objective must obtain the information necessary to achieve this goal while simultaneously ensuring that it can act on this information to achieve it.

Figure 3A:
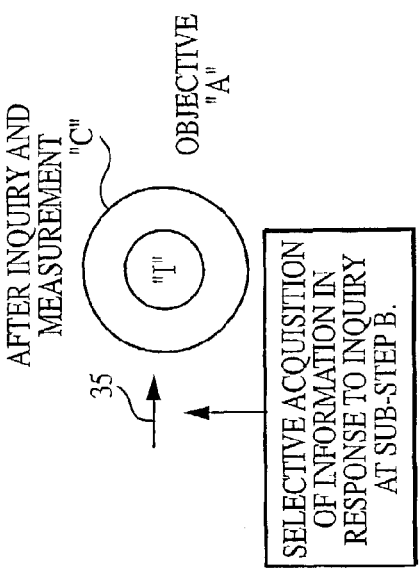
FIGS. 3 and 4 are I-diagram illustrations depicting examples of how the two feedback paths shown in FIG. 2 can be used.

FIG. 3a illustrates an information space "I" which pictorially represents the information necessary to achieve the computational or design objective. The system's 200 ability to ensure that it can act on this information space "I" to achieve the objective is represented by the information space "I" being wholly contained within the control space, "C". The marriage of the concepts of information and control is exemplified by the I-diagrams by virtue of the degree to which they are wholly or partially contained within one another.

FIGS. 3a-c and 4a-c illustrate, as separate examples, possible outcomes of the dynamic relationship between an information "I" and control "C" space for a system 200 attempting to achieve some computational objective, "A". As will be described, FIG. 3 illustrates an I-diagram sequence leading to a desirable outcome (i.e., satisfying or meeting the system objective) and FIG. 4 illustrates an I-diagram sequence leading to a undesirable outcome.

Referring initially to FIG. 3a, a system control space "C" and a system information space "I" are shown prior to taking some action (e.g., see 31 and 33) by the system 200. The information space "I" is shown to be wholly enclosed by the control space. From an information perspective, the system 200 is trying to acquire information to determine "what is the state-of-nature", external to the system, relative to the states the system 200 knows and cares about regarding possible actions to take in the future to satisfy the computational or design objective. Hence, such information represents a subjective property of the system 200. The information space "I" represents the possible external states-of-nature posited to exist from the systems 200 subjective point of view. Based on the system's subjective state-of-knowledge concerning the possible external states-of-nature and an available suite of questions or inquiries that can be posed, the system 200 attempts to distinguish which state-of-nature is true from among all subjectively posited states. This pursuit is constrained by what the system 200 can pose and measure.

In parallel with the process of seeking information, the system 200 attempts to exploit known information to purposefully place the external environment in a specific state or set of states, which if achieved, will satisfy the computational or design objective "A" of the system 200. A computational objective could be, for example, hitting a target or finding an address. The exploitation of known information by the system 200 to take one or more actions to achieve a desired state-of-nature is accomplished through the control space "C" (i.e., the possible system outputs or controls).

Figure 3B:
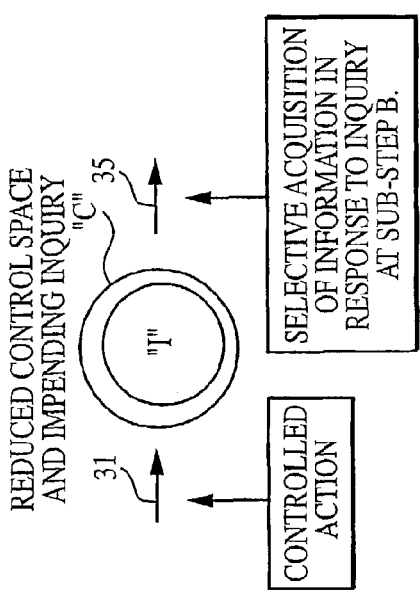
Figure 3C:
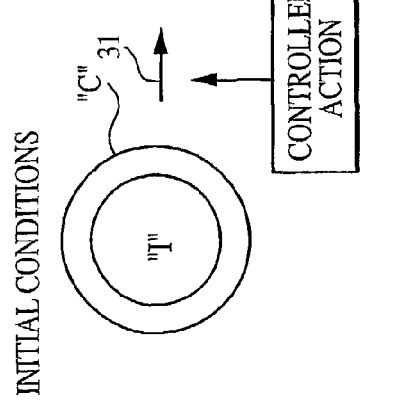

With particular reference to FIG. 3a, the control dynamics for system 200 is shown at an initial state, i.e., prior to taking some action (i.e., controlled action 31). FIG. 3a illustrates the information space "I" being wholly contained within the control space "C" prior to taking some action. Subsequent to taking action, as shown in FIG. 3b, the system 200 effectively reduces its control space "C" through feedback and the expenditure of system resources. By taking action, information acquired in the past is exhausted thereby giving rise to the need for additional information obtained through the elimination of possibilities regarding which state-of-nature is "true." It is emphasized that information is exhausted as a consequence of talking action, thereby inducing the need for additional information. The interplay or relationship of the two spaces is made dynamic through feedback. It is desired from the information perspective to eliminate possibilities regarding which state-of-nature is true so as to support required future actions. This objective translates into the information space being contained within the control space throughout the time-line of the process. In the case where this objective is not being met, and whereby actions are being eliminated faster than possibilities, the system objective may not be met as depicted by the sequence illustrated in FIGS. 4a-4c.

In the example I-diagram sequence of FIG. 3, FIGS. 3a and 3b illustrate the change in the I-diagrams which occur as a consequence of taking a controlled action 31 and obtaining additional information. As shown, the control space is reduced. Taking any action always has this result because by taking action, you lose possible actions that you can take in the future, due to the expenditure of resources by a system hence, the control space described by the outer circle shrinks. However, it is noted that the information space in FIG. 3b remains wholly contained within the control space subsequent to the controlled action 31. Subsequent to taking this action, the system 200 selectively acquires new information 35 thereby shrinking the information space.

Figure 4A:
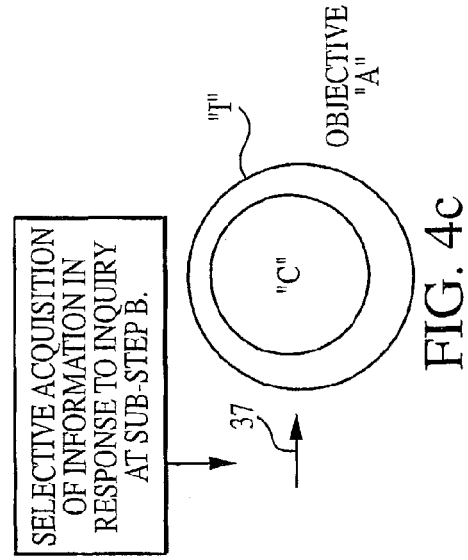
Figure 4B:
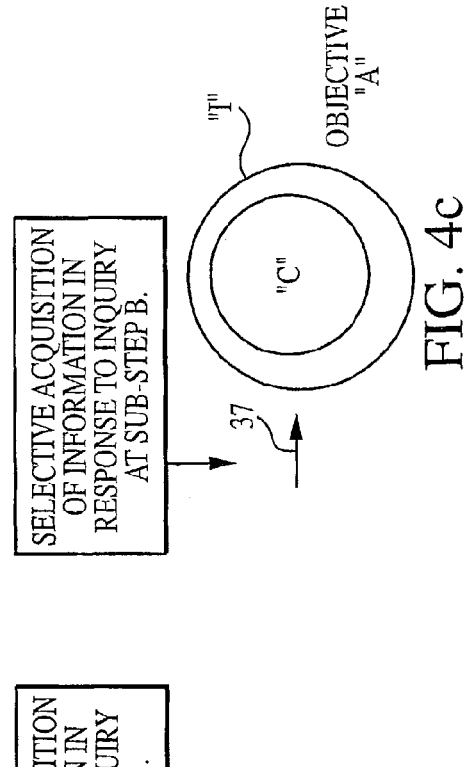
Figure 4C:
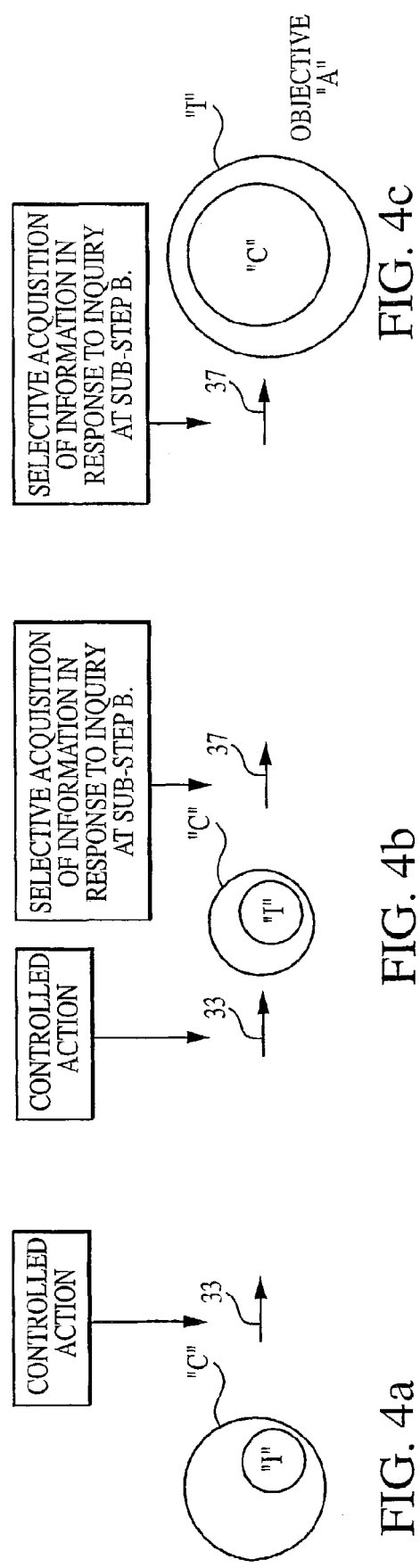

FIGS. 4a and 4b illustrates another I-diagram sequence where a controlled action 33 causes the information space to become marginally contained within the control space (see FIG. 4B) although still adequate. In this case, some additional action can be taken, but the breaching of the control space by the information space is imminent. Subsequent to this action, no new information is acquired 37 and the information space actually expands.

This causes the control and information spaces to become reversed leading to a possible system failure. In essence, this leads to a situation where the computational objective of the system "A" may no longer be achievable by virtue of the insufficiency of available information. That is, the system may not have adequate information to do what it has to do.

The conceptual framework using the I-diagrams of FIGS. 3 and 4 are further illustrated in the context of a real world example involving the design of a missile defense system. In such a system, a computational system objective "A" may be stated as follows:

Assuring that a target is sufficiently well localized in space so as to be contained within the continually shrinking reachable space or kinematic envelope of an intercepting missile.

If containment is accomplished over the entire engagement timeline, then a successful intercept is guaranteed by the defense system, thereby satisfying the system objective, "A".

Figure 5:
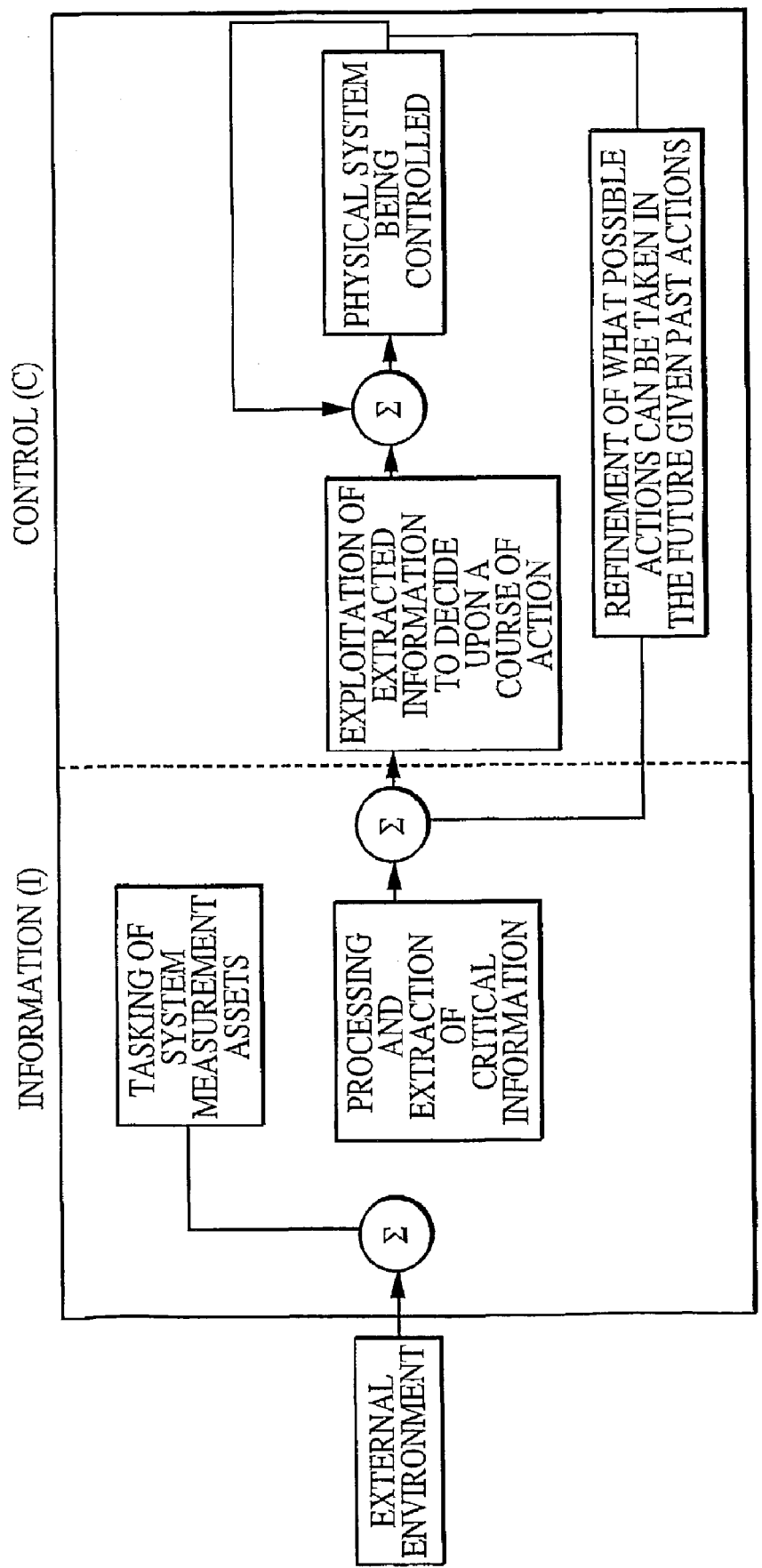
FIG. 5 is a formalized model that implements the sequence illustrated in FIG. 3.

FIG. 5 is an illustration of a block diagram of a fire control loop 500 as is commonly employed in missile defense systems. Fire control loop 500 attempts to resolve two intrinsic and inseparable cybernetic issues concerning the computational objective "A", namely: (1) localizing the target in space "I", i.e., the information issue, and (2) managing the assets of the system "C" so that they can be properly focused on the information space "I", i.e., the control issue. In the missile defense example, the information space "I" defines where the target can be and where it can go. The control space "C" defines where the intercepting missile is and where it can go. The fire-control loop 500 can be though of as a bi-directional governor whereby the relevant information "I" and the kinematic envelope of the intercepting missile "C" are continually matched, thereby ensuring the successful "capture" of the threat. Hence, it is reflective of the synergistic relationship between information and control. The matching of the information and control spaces is a dynamic process which adaptively balances the acquisition of information to the need to effect control and it is this matching process that is characteristic of the cybernetic system described below.

With regard to the information space, "I", defense system sensor assets provide information on the threat. Initially system radars, satellites, or other sensor assets are used to determine whether a threat is present, to localize the threat sufficiently well to support an engagement decision, and to direct in a gross fashion the intercepting missile during its flight. At some point during the engagement timeline, the sensor suite on the intercepting missile becomes active and begins to dominate in its utility to the closure of the fire control loop 500.

As the engagement timeline unfolds, system sensors must collectively provide information at an adequate rate to support the guidance of the missile. Concurrently, guidance commands are executed on the basis of available information and subjective knowledge of the reachable space of the missile in an attempt to ensure that the interceptor can successfully navigate to all possible places where the threat might be at the time of intercept. Since the reachable space of the interceptor decreases monotonically with time, system sensor assets must supply information at a sufficiently high rate to guarantee containment of the target inside the reachable space of the intercepting missile. This containment feature is generally illustrated in FIG. 3 which illustrates the information space being wholly contained within the control space.

Having highlighted a computational framework which described the operational paradigm of the present invention. We now consider the detailed steps for designing a cybernetic-based system, algorithm and the like in accordance with the method of the present invention. These steps generally include the following:

Step (1), i.e., Specifying an Objective for the System: As stated above, an objective defines the design purpose of the system:

This objective varies with the type of system being designed. For example, with regard to the missile defense system, previously described, the objective is re-stated here as: the collection of sufficient information on the threatening target using system sensor assets so as to ensure that the target localization volume (i.e., the volume of space though to contain the target based on all observable information) is maintained inside the continually shrinking kinematic envelope of the intercepting missile throughout the engagement time line. An I-diagram provides a useful construct for conceptualizing and explaining the operation of the system in its pursuant of the stated computational or design objective.

Step (2) i.e., Defining the Cybernetic Space of the System, Machine, Algorithm to be Constructed:

The cybernetic space consists of an information space and a control space, as illustrated in the I-diagram sequences of FIGS. 3 and 4. The information space defines all the possible states that nature (the environment external to the system) can be in as postulated by the system. Likewise, the control space defines all the possible states that can be reached as postulated by the system.

Step (3) i.e. Defining One or More Questions That the System Can Pose to the External World and Which May Possibly be Constrained by the Resources of the System or May Vary With Time:

In the cybernetic context, questions represent requests for information by the system at given instants in time. Questions are dynamic and are either information or control oriented. Informational questions are posed to the environment while control questions describe ways that actions can be effected to control the environment. Interrogative questions as defined here represent possible ways that the system can acquire information. For example, one can delineate possible waveforms that a radar can use to interrogate a target.

Information can be considered as that which enables one to answer a quantitative question that is posed. All questions can be quantified in the following sense. If a system poses a question to the environment, it can be assumed that the system possesses a list of all possible and distinct answers to that question and that it is in fact this list of answers that serve to mathematically and logically define the questions with regard to the system. The group of all possible answers to the question is defined as a system of assertions. In other words, a question is defined by the system of assertions that answers it. This is formalized by the following definition which is defined in Richard T. Cox "Of Inference and Inquiry," Proc. 1978 Maximum Entropy Formation Conference, 119-167, MIT Pres, 1979, incorporated herein by reference.

Definition I: A question A is defined by the exhaustive system of elementary assertions A={a1, a2, . . . , an} that describe all possible answers to the question A. Definition I essentially states that all questions give rise to a logical domain of assertions that abide by the principles of Boolean Algebra. A binary question or inquiry is defined by two complementary and elementary assertions A={a,~a}.

For example, let A equal the question "Is it raining or not?". This question is answered by the simple assertions a1="Yes it is" and ~a="No, it is not" and therefore A={a,~a}. Either assertion represents a discrete answer to the questions. Systems of assertions can have an essentially infinite number of possible assertions, but can often practically be defined using only a few.

Referring again to FIG. 2, it is shown that in accordance with the method of the present invention, according to the cybernetic paradigm, the system 200 selectively makes information requests to obtain or observe information acquired in response thereto. The system 200 then acts on this information (i.e., actions or decisions) to achieve a specified design or computational objective. Thus, the quantified questions provide for the selective acquisition of information by the cybernetic system 200. It is noted that questions are subjective in the sense that they are defined relative to the cybernetic system making the inquiry and that they pertain to the information space defined in Step 2.

One example of this method of inquiry is the game of 20 questions. The active player pursues a perfect knowledge regarding postulated possible states of nature that represents things that the other player may be thinking of. The player defines a priori questions that have bearing on this pursuit (i.e., selectively acquiring information) and a good player knows what are best successive questions to pose. So that when the player poses and then observes answers, these answers have meaning and are rendered as subjective information to the player. Thus questions are subjective entities in the sense that they are defined relative to the player, however, they abide by a set of objective and universal rules of manipulation that are consistent with Boolean Algebra. It is noted, that with respect to the game of 20 questions, an imposed system constraint is that only questions having a yes/no response are allowed. Again, these represent binary questions.

Step (4), i.e., Defining One or More Questions That the System Can Answer to Effect Control or Transmit Information and Which May Possibly be Constrained by the Resources of the System or May Vary With Time:

As stated in step (2), information cannot be obtained until one or more questions are defined and posed. Similarly, control cannot be meaningfully effected until all possible actions that can be taken are defined. The set of all possible actions taken at any instant define the control question of the system regarding what can be done. The set of all possible actions are defined, by way of analogy to logical questions that provide information, as a question answered by all possible actions that can be taken towards the achievement of the goal of the system. This question is answered by the system when it takes action.

With respect to step (3), i.e., the acquisition of information, occurs via the specific answers or actions to posed questions. With respect to step (4), decisions are selected and then effected answering the question of what should be done at that time to most efficaciously achieve the desired system goal.

Definition II: an assertion a is defined by an exhaustive system of elementary questions a={A1, A2 . . . , An} that describe all possible questions that can be answered by the assertion a. A binary assertion such a={A,~A} answers two complementary questions such as the decision to take the "up" or "down" escalator.

Systems of questions must by definition be exhaustive and also satisfy Boolean Algebra having an interpretation complementary to that of systems of assertions. As an example, define the assertion a="it is either raining or not raining". This assertion answers the two simple questions A1="Is it raining" and ~A1="is it not raining". Therefore a={A1,~A1}. A1 and ~A1 are so elementary that only one is answered while the other question receives no response.

Step (5) i.e., Applying an Inductive Logic Formalism of Logical Questions and Assertions to Formalize the Computational Objective and Arrive at a Cybernetic System Architecture:

Step (5) involves three separate sub-processes which can be stated as:

I. The matching of acquired information to the controls to be effected;
II. Formalizing what occurs when a question is posed and information obtained; and
III. Formalizing what occurs when an action is taken in terms of what actions are subsequently possible.

Each sub-process is described as follows. Regarding sub-process I, the matching of information to control is bi-directional and corresponds to matching the required information to desired control and effecting desired control based on acquired information. In essence, process I sets requirements for what information and what actions should be effected hence guiding processes II and III.

Control dictates requirements for how the information space "I" needs to be further restricted in terms of possibilities. Likewise, available information provides constraints on the suite of possible actions that can be taken. The I-diagrams shown in FIGS. 3 and 4 represent possible states that nature can be placed in.

Referring again to the missile defense example, the information and control spaces correspond to the possible positions and velocities of the threat and the intercepting missile, respectively. These "possibilities" are established in step 2 and correspond to the cybernetic space of the system being designed.

Formalizing sub-process II requires the quantification of how possibilities are eliminated or modified (i.e., the reduction of the control space) when new information is acquired. If answers to posed questions serve to eliminate possibilities, then the a priori probabilities associated with those possibilities that are eliminated must be distributed across those possibilities that remain. The unique mathematical formalism for accomplishing this is minimized relative entropy whereby one transitions from an initial state of system knowledge to a unique new state. States of system knowledge correspond to the probability distribution possessed by the system regarding the likelihood that nature resides in any of the suite of postulated states deemed possible. This is reflected by the I-diagrams shown in FIGS. 3 and 4.

The other way that the state of knowledge of the system can be modified is inferentially via Bayes' Theorem. In this case, posed questions do not serve to eliminate possibilities but rather serve to modify the probabilities of those existing states deemed possible. Prior to posing questions that provide this type of information, the system poses an a priori probability distribution across possible states. The posed question has associated with it a likelihood function that upon measurement (actually obtaining the information requested by the posed question) permits the updating of the a priori probability distribution to an a posterior distribution using Bayes' Theorem that then reflects the updated state of knowledge of the system. The formal mathematical techniques that are employed in the processing of each type of information described represent tools provided by the theory of inductive logic.

The formalization of process III requires a detailed physical characterization of the elements used in the construction of the system. Generally, process III is a generic physics or engineering consideration. In particular, it is required that formal expressions be configured regarding how system resources are expended as decisions and actions are made.

Exemplary Embodiment

The method steps described above, are now described in the context of an example to help demonstrate the operation and benefits of the method of the present invention for automatically designing cybernetic systems. The example will be described in the context of the method steps defined above for designing a cybernetic based system.

Regarding step (1), it is the objective, "A" of the present example to design a neuron having optimized information throughput. It will be shown that the single model neuron represents in many regards a simplest cybernetic device.

Regarding step (2), i.e., defining the cybernetic space of the system, machine, or the algorithm to be constructed. The information space is defined by the system as all of the possible states that nature can be in.

Figure 6:
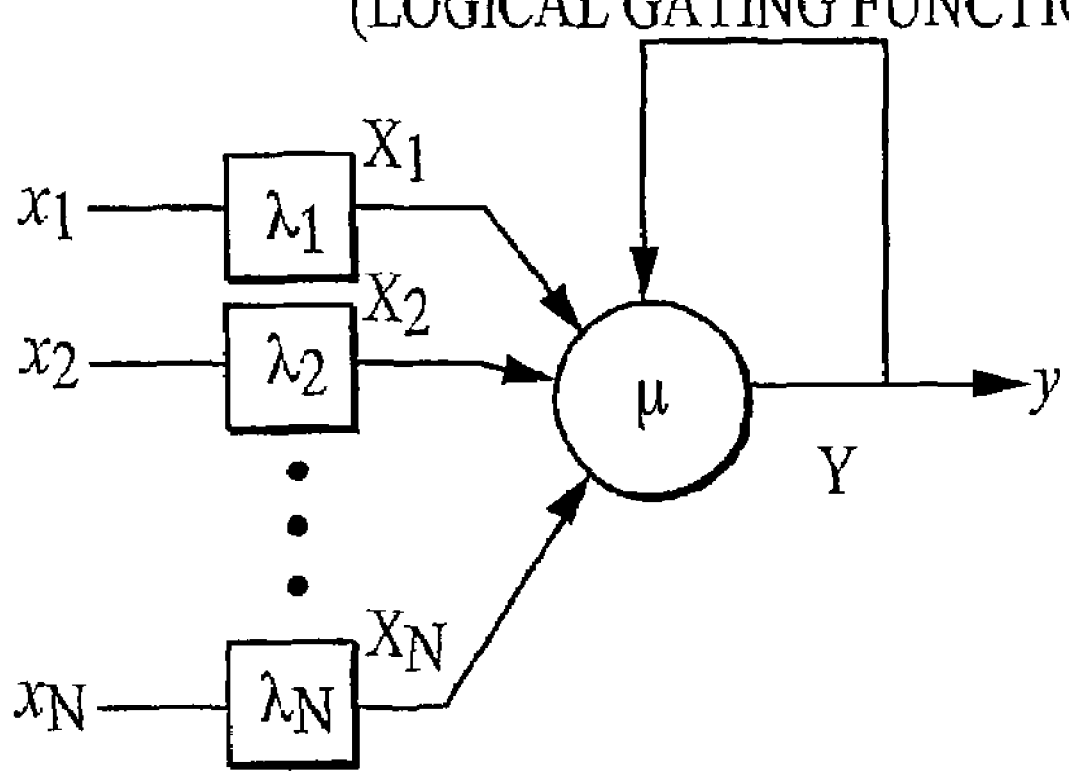
FIG. 6 is an illustrative example of one application of the present invention illustrating a simplified model of a single neuron.

Referring now to FIG. 6, a typical model of a neuron is shown having 5000 inputs (i.e., N=5000), where each input can take, at any time, one of two discrete values:

$$X_i = \{x_i, \sim x_i\}$$

In the cybernetic paradigm described here, each input is really represented by a binary question that is answered by the presentation of an input signal $X_i$; the input space in the present example is discrete and has 5000 information questions $X_i$, i=1 to 5000. Each coordinate in the input space corresponds to a binary question. The environment of the neuron provides answers to each of the 5000 questions that are binary in nature. The information space is therefore an exhaustive listing of all of the possible combinations of externally supplied inputs. Stated otherwise, the input space is a representation of all of the discrete points in space wherein the input might lie with regard to the system. In the present example, the input space has $2^{5000}$ assertions, representing all the possible combinations of answers the system can obtain to the questions it poses to the environment.

With continuing reference to FIG. 6, the neuron is shown to have a single output (one-dimensional) which can take one of two discrete values. Hence, the output space has two values in the present example.

Regarding steps (3) and (4), i.e., where step (3) is restated as:

Defining one or more questions that the system can pose to the external world as possibly be constrained by the resources of the system or may vary with time. And step (4) is restated as:

Defining one or more questions that the system can answer to effect action or transmit information as possibly be constrained by the resources of the system or may vary with time.

Assuming the neuron to be designed is capable of measuring N+1 things. The first N things capable of measurement correspond to the logical conjunction of the single output y with each of the inputs x, x*y. Hence, the system can measure N, e.g., 5000, input-output correlations. This captures step (3) in that it defines what is meant by asking one or more questions to the external world. In this example, the one or more questions is embodied as N (e.g., 5000) input-output correlations.

There is one further assumption to be considered. While the model neuron can measure N, where N=5000, input-output correlations, it must also be specified what the model neuron can remember or store. In the case of a neuron, there is no existing memory to store or record each measurement. This represents a system constraint. The assumption made in the present example, in light of the system constraint, is that the neuron is capable of storing only the averages <x*y> and <y> of the measurements.

Step (4) pertains generally to the notion of answering questions. More particularly step (4) pertains to the one or more questions that the system can answer to effect control or transmit information is equivalent, in the present example, to the output space defined at step (2). Referring again to step (2), the output of control space defines the possible states that the system would like to place the external environment in. In the present example, the output of the control space corresponds to the single-dimensioned binary question Y={y,~y}. Specifically, a neuron either generates an action-potential y or it does not ~y thereby answering Y.

With regard to step (4), wherein one or more questions are provided or defined that the system can answer to effect control or transmit information. In the present example, the single question that the system can answer can be stated as: Do I (the system) want to generate an action potential or not. The answer to this question corresponds to the control space as recited at step (2).

The last step, step (5), can then be executed by matching the information acquired to the decisions made and at the same time, maximizing the information content of the output and matching this to the acquired information. This process will maximize the information throughput.

Specifically, matching acquired information X to decisions Y requires extremizing the information common to these questions XvY. Induction logic states that this can be done by extremizing the mutual information between X and Y I(X;Y). Similarly, maximizing the output information contained in Y requires maximizing the output entropy of the neuron H(Y). Mutual information I(X;Y) and entropy H(Y) correspond to the same quantities as defined in information theory.

The above method steps may be implemented in some combination of software and hardware to be executed by one or more general purpose and/or dedicated processors.

What has been described herein is merely illustrative of the application of the principles of the present invention. For example, the method described above and implemented as the best mode for operating the present invention are for illustration purposes only. Other arrangements and methods may be implemented by those skilled in the art without departing from the scope of spirit of the invention.

What is claimed is:

1. A method for designing a missile defense system architecture for intercepting a target missile whereby information and control represent dual and subjective properties of the system, the method comprising the steps of:
    specifying as a missile defense system objective localizing the target missile in space so as to be contained within the continually shrinking space or kinematic envelope of an intercepting missile;
    defining an information space as where the target missile can be and where it can go and a control space as where the intercepting missile is and where it can go;
    posing at least one question to an environment external to said missile defense system;
    using a missile defense system sensor asset to acquire information about said external environment in response to said at least one posed question;
    defining at least one question answerable by said missile defense system to take an action to effect control by said missile defense system over said external environment;
    using a computer to mathematically derive said missile defense system architecture based on the specified missile defense system objective, the acquired information from the at least one posed question and said controls effected by the at least one question answerable by said missile defense system; and
    using the derived missile defense system architecture to intercept the target missile.

2. The method of claim 1, wherein said information space includes a plurality of possible states that said external environment may be placed in.

3. The method of claim 2, wherein the step of using a computer to mathematically derive said missile defense system architecture based on the acquired information further includes the step of using said acquired information to eliminate from consideration at least one of a plurality of possible states that said external environment may presently be in.

4. The method of claim 1, wherein the step of using a computer to mathematically derive said missile defense system architecture is achieved using minimized relative entropy.

5. The method of claim 1, wherein the step of using a computer to mathematically derive said missile defense system architecture is achieved inferentially using Bayes' Theorem.

6. The method of claim 1 wherein the step of using a computer to mathematically derive said missile defense architecture further includes the step of deriving one or more formal expressions pertaining to how said system resources are expended responsive to said missile defense system taking said at least one action to effect control over said external environment.

7. The method of claim 1, wherein said information space includes all possible states of said external environment as determined from the perspective of said missile defense system.

8. The method of claim 1, wherein the at least one question the missile defense system can pose define information requests by the missile defense system.

9. The method of claim 1, the at least one question the missile defense system can answer is a control oriented question.

10. The method of claim 1, wherein the action taken by said system to effect control is one of a plurality of actions defined by said at least one question answerable by said missile defense system.

11. A system for designing a missile defense system architecture for intercepting a target missile whereby information and control represent dual and subjective properties of the system, the system comprising:
    means for specifying a missile defense system objective localizing the target missile in space so as to be contained within the continually shrinking space or kinematic envelope of an intercepting missile;
    means for defining an information space as where the target missile can be and where it can go and a control space as where the intercepting missile is and where it can go;
    means for posing at least one question to an environment external to said missile defense system;
    missile defense system sensor asset means for acquiring information about said external environment in response to said at least one posed question;

means for defining at least one question answerable by said missile defense system to take an action to effect control by said missile defense system over said external environment;

computer means for mathematically deriving missile defense system architecture based on the specified missile defense system objective, the acquired information from the at least one posed question and said controls effected by the at least one question answerable by said missile defense system to intercept the target missile.

12. The system of claim 11, wherein the computer means for mathematically deriving said missile defense system architecture based on the specified missile defense system objective, the acquired information and the at least one question answerable by said missile defense system further comprises means for derive one or more formal expressions pertaining to how said system resources are expended responsive to said system taking at least one action to effect control over said external environment.

13. The system of claim 11, wherein the computer means for mathematically deriving said missile defense system architecture based on the specified missile defense system objective, the acquired information and the at least one question answerable by said missile defense system further comprises:

means for constructing one or more I-diagrams that capture the specified missile defense system objective;

means for translating the one or more I-diagrams into one or more mathematically stated objectives; and means for evaluating the one or more mathematically stated objectives to yield said missile defense system architecture.

* * * * *